United States Patent
Nakajo et al.

(10) Patent No.: US 7,244,957 B2
(45) Date of Patent: Jul. 17, 2007

(54) GROUP III NITRIDE COMPOUND SEMICONDUCTOR LIGHT-EMITTING DEVICE AND METHOD FOR PRODUCING THE SAME

(75) Inventors: Naoki Nakajo, Aichi-ken (JP); Masao Kamiya, Aichi-ken (JP); Tetsuya Taki, Aichi-ken (JP)

(73) Assignee: Toyoda Gosei Co., Ltd., Nishikasugai-gun (JP)

( * ) Notice: Subject to any disclaimer, the term of this patent is extended or adjusted under 35 U.S.C. 154(b) by 169 days.

(21) Appl. No.: 11/063,747

(22) Filed: Feb. 24, 2005

(65) Prior Publication Data

US 2005/0277218 A1   Dec. 15, 2005

(30) Foreign Application Priority Data

Feb. 26, 2004   (JP)   ............................. 2004-051842
Sep. 30, 2004   (JP)   ............................. 2004-286219

(51) Int. Cl.
*H01L 29/06* (2006.01)
*H01L 21/00* (2006.01)

(52) U.S. Cl. ............................. 257/13; 257/12; 257/14; 438/46; 438/47

(58) Field of Classification Search .................. 438/29, 438/31, 32, 37, 46, 47; 257/12, 13, 14, 79, 257/85, 94, 95, 98
See application file for complete search history.

(56) References Cited

U.S. PATENT DOCUMENTS 5,684,823 A * 11/1997 Goto et al. .................... 438/32
6,469,320 B2 * 10/2002 Tanabe et al. ................. 257/79
6,495,862 B1 * 12/2002 Okazaki et al. ............. 257/103
6,670,204 B2 * 12/2003 Tanabe et al. ................. 438/22
6,711,193 B2 *  3/2004 Yamasaki ................. 372/45.01
6,809,351 B2 * 10/2004 Kuramoto et al. .......... 257/190
6,979,835 B1 * 12/2005 Yu et al. ........................ 257/22
6,984,841 B2 *  1/2006 Tsuda et al. ................... 257/12
7,038,300 B2 *  5/2006 Hsu et al. .................... 257/617
2003/0062530 A1   4/2003 Okazaki et al.

FOREIGN PATENT DOCUMENTS

JP    5-167101    7/1993

* cited by examiner

*Primary Examiner*—Kevin M. Picardat
(74) *Attorney, Agent, or Firm*—McGinn IP Law Group, PLLC (57) ABSTRACT

In a Group III nitride compound semiconductor light-emitting device which outputs lights from a semiconductor plane, about 1.5 μm in height of a Group III nitride compound semiconductor projection part 150, which is made of Mg-doped p-type GaN having Mg doping concentration of $8 \times 10^{19}/cm^3$ and is formed through selective growth, is formed on a p-type contact layer (second p-layer) 108. And a light-transparency electrode 110 is formed thereon through metal deposition. The Group III nitride compound semiconductor projection part 150 makes a rugged surface for outputting lights and actual critical angle is widened, which enables to improve luminous outputting efficiency. And because etching is not employed to form the ruggedness, driving voltage does not increase.

20 Claims, 5 Drawing Sheets

GROUP III NITRIDE COMPOUND SEMICONDUCTOR LIGHT-EMITTING DEVICE AND METHOD FOR PRODUCING THE SAME

TECHNICAL FIELD

The present invention relates to a Group III nitride compound semiconductor light-emitting device represented by the formula $Al_xIn_yGa_zN$ ($x+y+z=1$, $0 \leq x \leq 1$, $0 \leq y \leq 1$, $0 \leq z \leq 1$) and to a method for producing the light-emitting device. Especially the present invention relates to a Group III nitride compound semiconductor with the structure which provides higher efficiency of outputting lights.

BACKGROUND ART

In recent years, a Group III nitride compound semiconductor light-emitting device is widely used in a field of a light-emitting diode (LED) which emits any one of green, blue, and ultra-violet lights and has advantages in reduction in size and weight and longer operating life. Demands on a LED having higher luminous intensity and more excellent efficiency are also increasing. In order to improve luminous intensity and efficiency of a LED, outputting efficiency of the lights which is emitted from the emission layer, or external quantum efficiency, needs to be improved along with increasing internal quantum efficiency. With respect to improving external quantum efficiency, there are known Patent application laid-open No. 2000-196152 and Patent application laid-open No. H5-167101.

DISCLOSURE OF THE PRESENT INVENTION

Problems to be Solved in the Invention

Generally, the surface of the growth front of a Group III nitride compound semiconductor light-emitting device which is formed through epitaxial growth is flat. On the contrary, refractive index of a Group III nitride compound semiconductor light-emitting device is as large as about 2.6. When lights generated in an active layer are outputted to the outside where refractive index is relatively smaller than that of the semiconductor layer, all the incident lights which are incident to the plane for outputting lights at an angle from the normal line larger than a critical angle are reflected to inside of the semiconductor. In short, when the refractive index inside of the semiconductor is larger than that outside of the semiconductor, the difference between those refractive indexes is sufficiently large, and further the plane for outputting lights is flat, large amount of lights which are generated in the active layer cannot be outputted from the semiconductor.

The patent documents described above disclose to form a cylindrical ruggedness on the plane for outputting lights. That can increase external quantum efficiency, however, it is too difficult to form a thin and accurate ruggedness on the plane for outputting lights considering the current level of general processing technology for mass production.

Moreover, surface treatment (e.g.: chemical etching) for forming a random and irregular ruggedness which is conventionally carried out to a layer made of material such as GaP is not applicable to chemically stable material such as GaN because of taking too much time. And because of a damage layer which is formed at the surface of a semiconductor through such etching treatment, ohmic constant of a light-transparency electrode on the surface to the semiconductor becomes insufficient, which causes a problem of enlarging driving voltage of a semiconductor device.

The present invention has been accomplished in an attempt to solve the aforementioned problems, and an object of the present invention is to obtain a Group III nitride semiconductor light-emitting device having excellent external quantum efficiency by improving luminous outputting efficiency without increasing driving voltage and complexing process comparing with conventional art described above.

Means to Solve the Problems

In order to overcome the above-described drawbacks, the followings may be useful.

That is, a first aspect of the present invention is a Group III nitride compound semiconductor light-emitting device which is formed by depositing a Group III nitride compound semiconductor on a substrate through epitaxial growth, wherein ruggedness is formed on a growth plane of a Group III nitride compound semiconductor which outputs lights.

In the present invention, flatness of the plane for outputting lights is decreased by forming the ruggedness thereon so as to vary angles of the plane for outputting lights physically and in various angles. As a result, the lights emitted from an emission layer can be outputted at various angles. That enables to enlarge the effective critical angle, to thereby improve luminous output efficiency.

A second aspect of the present invention is a light-emitting semiconductor wherein the convex part of the ruggedness is a Group III nitride compound semiconductor which is formed through selective growth.

In the present invention, the ruggedness of the semiconductor plane for outputting lights is formed by using a Group III nitride compound semiconductor represented by $Al_xIn_yGa_zN$ ($x+y+z=1$; $0 \leq x \leq 1$; $0 \leq y \leq 1$; $0 \leq z \leq 1$). In short, the convex part is formed by growing the Group III nitride compound semiconductor again.

A third aspect of the present invention is a light-emitting device wherein the semiconductor layer on which the convex part is formed and the convex part are both made of a p-type Group III nitride compound semiconductor.

In the present invention, the ruggedness of the semiconductor plane for outputting lights is formed b using a Group III nitride compound semiconductor represented by $Al_xIn_yGa_zN$ ($x+y+z=1$; $0 \leq x \leq 1$; $0 \leq y \leq 1$; $0 \leq z \leq 1$) through selective growth while it is doped with p-type impurity. In short, the convex part is formed by growing a p-type Group III nitride compound semiconductor again on a p-type Group III nitride compound semiconductor.

A fourth aspect of the present invention is a light-emitting device wherein a light-transparency electrode is formed on at least one of a portion and the entire surface of the ruggedness.

In the present invention, a light-transparency electrode is formed on the ruggedness which functions as the plane for outputting lights in order to diffuse electric current and to maintain luminous output efficiency. When electric current is sufficiently diffused by forming a light-transparency electrode only at a portion of the ruggedness, it is not necessary to form it on the entire surface of the ruggedness.

A fifth aspect of the present invention is a light-emitting device wherein the light-transparency electrode is formed on the surface of the ruggedness except on the convex parts, i.e., projection parts, of the ruggedness.

In the present invention, optical absorption by the light-transparency electrode is decreased by not forming a light-transparency electrode at the projection part, which is a portion of the plane for outputting lights.

A sixth aspect of the present invention is a light-emitting device wherein the light-transparency electrode is formed by using indium tin oxide (ITO).

A seventh aspect of the present invention is a method for producing a Group III nitride compound semiconductor light-emitting device, comprising: forming an n-type Group III nitride compound semiconductor layer, an emission layer, and a p-type Group III nitride compound semiconductor layer on a substrate; forming a mask on an uppermost layer of the Group III nitride compound semiconductor layer on which a Group III nitride compound semiconductor does not grow; removing a portion of the mask; and selectively growing a Group III nitride compound semiconductor on the exposed portion of the uppermost layer where the mask is partially removed so as to form a convex part for outputting lights on the surface of the uppermost layer.

A eighth aspect of the present invention is a method for producing a Group III nitride compound semiconductor light-emitting device wherein a p-type impurity is doped in the selective growing of the Group III nitride compound semiconductor.

An ninth aspect of the present invention is a method for producing a Group III nitride compound semiconductor light-emitting device wherein growth temperature in the selective growth is 1100° C. or less. More preferably, growth temperature may be in a range of 900° C. to 1050° C.

In the present invention, the growth temperature in the selective growth process is lower than the growth temperature of the p-layer. Generally, the growth temperature of an emission layer made of a Group III nitride compound semiconductor which comprises indium (In) is in a range of 700° C. to 900° C., which is effective for suppressing thermal damages toward the emission layer.

A tenth aspect of the present invention is a method for producing a Group III nitride compound semiconductor wherein the mask is formed by using silicon oxide ($SiO_2$) or silicon nitride ($Si_3N_4$).

An eleventh aspect of the present invention is a method for producing a Group III nitride compound semiconductor light-emitting device wherein the light-transparency electrode is formed by using indium tin oxide (ITO).

Effect of the Invention

In the present invention, ruggedness made of a Group III nitride compound semiconductor is formed on the semiconductor surface which functions as a plane for outputting lights. As a result, effective average critical angle becomes larger and optical outputting efficiency (external quantum efficiency) can be improved.

Further, by forming ruggedness made of a Group III nitride compound semiconductor, ruggedness can be obtained without carrying out etching. That enables to provide ruggedness without a damage layer and to easily obtain ohmic contact when an electrode is formed on the rugged surface. That enables to prevent from increasing driving voltage of the light-emitting device. Comparing with a process for forming ruggedness through etching, growth time and material of a semiconductor which is etched and time required for carrying out etching can be saved by employing the process for forming ruggedness in the present invention.

In the present invention, the convex part, i.e., projection part, made of a p-type Group III nitride compound semiconductor is formed on the p-type Group III nitride compound semiconductor through selective growth. As a result, the entire area of the ruggedness can become a semiconductor of p-type conductivity, which enables to use the whole plane for outputting lights as a contact layer.

And in the present invention, a light-transparency electrode is formed on a portion or on the entire surface of the ruggedness which functions as a plane for outputting lights. As a result, electric current can be diffused and luminous outputting efficiency can be maintained. When electric current is sufficiently diffused by forming a light-transparency electrode only at a portion of the ruggedness, it is not necessary to form it on the entire surface of the ruggedness. In order to diffuse electric current, the rugged surface is preferably made of a conductive semiconductor, and more preferably, a p-type semiconductor.

In the present invention, the light-transparency electrode is formed on the surface of the ruggedness except on the convex parts of the ruggedness. As a result, optical absorption and reflection by the light-transparency electrode can be decreased and luminous outputting efficiency can be maintained. Generally a light-transparency electrode also absorbs and reflects lights. By not forming the light-transparency electrode at each of the convex part, it becomes possible to output lights more efficiently.

In the present invention, the n-type Group III nitride compound semiconductor layer, the emission layer, and the p-type Group III nitride compound semiconductor layer are formed on the substrate, a mask on which a Group III nitride compound semiconductor does not grow is formed on the uppermost layer of the Group III-nitride compound semiconductor layer, a portion of the mask is removed, and a convex part is formed on the surface of the semiconductor at the removed portion of the mask by forming the Group III nitride compound semiconductor through selective growth. That enables to provide ruggedness on the plane of the semiconductor layer for outputting lights without damaging the Group III nitride compound semiconductor layer.

By doping a p-type impurity into the Group III nitride compound semiconductor layer which is grown on the removed portion of the mask, the entire rugged surface can have conductivity. And by forming the light-transparency electrode, electric current can be diffused efficiently.

In the present invention, growth temperature in the selective growth is 1100° C. or less. That enables to suppress damages to the emission layer whose growth temperature is comparatively low. Considering the condition for growing the Group III nitride compound semiconductor through selective growth, more preferable growth temperature may be in a range from 900° C. to 1050° C.

When the light-transparency electrode is formed by using an indium tin oxide (ITO), efficiency of outputting lights is remarkably improved compared with a light-transparency electrode made of a metal thin-film.

The light-transparency electrode made of indium tin oxide (ITO) may be used as a mask for selective growth. That is effective for producing a light-emitting device because processes of forming the mask and a window and removing the mask can be abbreviated different from a mask which is made of other material, e.g., silicon oxide ($SiO_2$) or silicon nitride ($Si_3N_4$)

BEST MODE FOR CARRYING OUT THE INVENTION

Embodiments of the present invention will next be described with reference to the drawings. Characteristic features of the present invention have been described above are also the best mode for carrying out the invention, and the present invention is not limited to the below-described specific embodiments.

A light-emitting device of the present invention has characteristics that the ruggedness is formed on the surface of the uppermost layer, which is a light outputting plane, by selectively growing a Group III nitride compound semiconductor, thereby improving efficiency of outputting lights.

The selective growth method in the present invention means a method which limits a growth region of a semiconductor by forming a region on which a semiconductor can grow and a region on which a semiconductor cannot grow on a semiconductor growth plane. By forming a Group III nitride compound semiconductor only on the region on which a semiconductor can grow, an uneven plane of Group III nitride compound semiconductor can be obtained.

The selective growth method of the present invention is preferably carried out with maintaining a facet plane. As a facet plane, for example, a (1–101) plane or a (11–22) plane of a Group III nitride compound semiconductor can be applied. Here "–1" and "–2" originally means signs each of which has a bar "–" over "1" and "2". Such a plane can maintain approximately about 60° to a C-plane (0001 plane). Here the convex part may not necessarily be formed in "an ideal six-sided pyramid." Plurality of convex parts formed in one area of the selective growth region, i.e., a window, may not be necessarily combined in one part at each of the selective growth region. It is not necessary to form one convex part along with the entire area of one selective growth region with no space. According to experiments of the inventors of the present invention, even when certain one circular selective growth region is formed, a convex part is not formed along with the entire region. Also, even when the convex part is formed in a mesa-pyramid shape (it may not limited to a six-sided mesa-pyramid), effect of outputting lights can be improved by 15% to 35%.

Here the substrate which is used for crystal growth may be made of such as sapphire, spinel, Si, SiC, ZnO, MgO or a Group III nitride compound semiconductor. As a method for forming a Group III nitride compound semiconductor layer through crystal growth, molecular beam epitaxy (MBE), metal-organic vapor phase epitaxy (MOVPE), halide vapor phase epitaxy (HVPE), liquid phase epitaxy (LPE), or the like may be used.

As used herein, the term Group III nitride compound semiconductor generally refers to a binary, ternary, or quaternary semiconductor having arbitrary compound crystal proportions and represented by the formula $Al_xIn_yGa_zN$ ($x+y+z=1$, $0 \leq x \leq 1$, $0 \leq y \leq 1$, $0 \leq z \leq 1$). A semiconductor doped with p-type or n-type impurity is also included in a group III nitride compound semiconductor described in the present specification.

A portion of Group III elements (Al, Ga, In) may be partially replaced with boron (B) or thallium (Tl), and a portion of nitrogen (N) may be replaced with phosphorous (P), arsenic (As), antimony (Sb), or bismuth (Bi). Such a semiconductor may also be included in "a Group III nitride compound semiconductor" in the present specification.

Examples of the aforementioned p-type impurity (acceptor) include, for example, zinc (Zn), beryllium (Be), calcium (Ca), strontium (Sr), barium (Ba), or magnesium (Mg).

Examples of the aforementioned n-type impurity (donor) include, for example, silicon (Si), sulfur (S), selenium (Se), tellurium (Te), carbon (C), or germanium (Ge).

These impurities may be incorporated in combination of two or more species, and a p-type impurity and an n-type impurity may be incorporated in combination.

Alternatively, the emission layer may have single quantum-well (SQW) structure or multiple quantum-well (MQW) structure. The emission layer may be an undoped layer. Alternatively, the emission layer may have n-type or p-type conductivity. A layer having each function can be formed on or beneath the emission layer: the layer may be, for example, an undoped layer, an n-layer or a p-layer. Further alternatively, the device may have structure such as homo pn junction, single hetero junction, or double hetero junction structure.

Multiple quantum-well structure constructing the emission layer may comprise a well layer made of a Group III nitride compound semiconductor which is represented by the formula $Al_xIn_yGa_zN$ ($x+y+z=1$, $0 \leq x \leq 1$, $0 < y \leq 1$, $0 \leq z \leq 1$) and comprises at least indium (In). The emission layer may comprise, for example, a well layer made of a doped or undoped $Ga_{1-y}In_yN$ ($0 < y \leq 1$) and a barrier layer which is made of a Group III nitride compound semiconductor AlGaInN having arbitrary compound crystal proportions and has band gap larger than that of the well layer. As an preferable example, an undoped $Al_xIn_yGa_zN$ ($x+y+z=1$, $0 \leq x \leq 1$, $0 < y \leq 1$, $0 \leq z \leq 1$) well layer and an undoped GaN barrier layer may be formed.

Each of the light-transparency electrode, the p-electrode (pad electrode), and the n-electrode can be made of a material which is well-known as a material used for forming a Group III nitride compound semiconductor device. The light-transparency electrode can be, for example, a metal thin-film electrode which comprises gold or an alloy made of gold and other metal. Especially, an alloy made of gold and cobalt and an alloy made of gold and nickel have been well-known. An alloy may be obtained by laminating two metal layers alternately and then heating the two layers.

As a light-transparency electrode, for example, tin oxide, zinc oxide, and other oxide compound electrode can be used. Especially, indium tin oxide (ITO) is useful because it has excellent light-transparency in green-color, blue-color, violet-color and ultraviolet-color region, which is the main wavelength region of a Group III nitride compound semiconductor light-emitting device. An oxide compound electrode is manufactured by employing an arbitrary and well-known method such as sputtering, electron beam deposition, and resistance heating deposition.

For the mask in the selective growth process, an arbitrary material which can prevent the Group III nitride compound semiconductor from growing epitaxially may be used. That is, a metal material such as titanium, a semiconductor such as amorphous silicon, an oxide compound, an inorganic material, an organic material, and other arbitral material may be used. Especially, silicon oxide (SiO$_2$) or silicon nitride (Si$_3$N$_4$) is preferable and useful for forming the mask, forming a window (at the exposed portion of the selective growth region), and removing the mask after selective growth. When indium tin oxide (ITO) is used to form the mask in the selective growth process, it is important to keep the temperature comparatively low so as to prevent deterioration of indium tin oxide (ITO), especially to prevent deterioration of light-transparency.

FIRST EMBODIMENT

Figure 1:
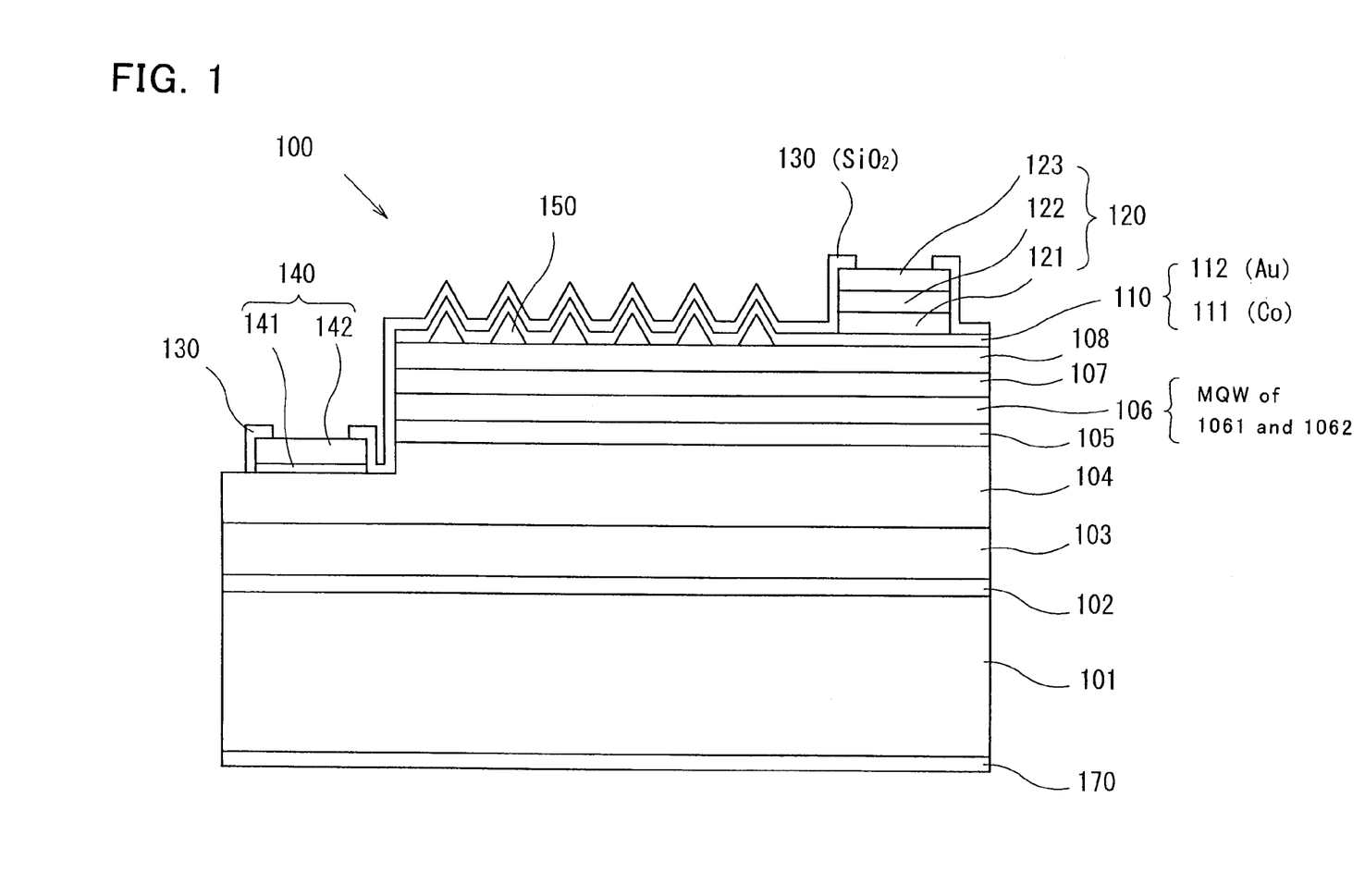
FIG. 1 is a cross-sectional view of a semiconductor light-emitting device 100 according to a first embodiment of the present invention.

FIG. 1 illustrates a sectional view of a Group III nitride compound semiconductor light-emitting device of the present invention. The Group III nitride compound semiconductor device 100 is a light-emitting device comprising the following structure. That is, as shown in FIG. 1, the Group III nitride compound semiconductor comprises about 100 µm in thickness of sapphire substrate 101. On the substrate 101, about 15 nm in thickness of a buffer layer 102 consisting of aluminum nitride (AlN), about 50 nm in thickness of an undoped GaN layer 103, and about 5 µm in thickness of an n-type contact layer (n$^+$-layer having a high carrier concentration) 104 consisting of silicon (Si) doped GaN, which has doping concentration of 1×10$^{18}$/cm$^3$, are formed in sequence.

On the n-type contact layer 104, about 25 nm in thickness of an n-type clad layer 105 consisting of silicon (Si) doped Al$_{0.15}$Ga$_{0.85}$N whose doping concentration is 1×10$^{18}$/cm$^3$ is formed. An emission layer 106 having a multiple quantum well (MQW) structure is then formed on the n-type clad layer 105. The emission layer 106 comprises 3 pairs of about 3 nm in thickness of a well layer 1061 consisting of undoped In$_{0.2}$Ga$_{0.8}$N and about 20 nm in thickness of a barrier layer 1062 consisting of undoped GaN.

Further, about 25 nm in thickness of p-type clad layer (first p-layer) 107 consisting of Mg doped p-type Al$_{0.15}$Ga$_{0.85}$N, which has a doping concentration of 2×10$^{19}$/cm$^3$, is formed on the emission layer 106. About 100 nm in thickness of p-type contact layer (second p-layer) 108 consisting of Mg doped p-type GaN, which has a doping concentration of 8×10$^{19}$/cm$^3$, is formed on the p-type clad layer 107.

On the p-type contact layer 108, about 1.5 µm in height of Group III nitride compound semiconductor projection part 150 consisting of Mg-doped p-type GaN with a doping concentration of 8×10$^{19}$/cm$^3$, which is formed through selective growth treatment, is formed.

A light-transparency electrode 110 is formed on the p-type contact layer (the second p-layer) 108 and the Group III nitride compound semiconductor projection part 150, and an n-electrode 140 is formed on the n-type contact layer 104. The light-transparency electrode 110 comprises a first layer 111 which has a thickness of about 4 nm and made of cobalt (Co) and a second layer 112 which has a thickness of about 10 nm, made of gold (Au) and contacts to the Co layer. Because the light-transparency electrode 110 is formed on the uneven surface of the semiconductor, it has a larger contact area and excellent ohmic characteristic.

A thick-film p-electrode 120 is formed by depositing about 18 nm in thickness of first layer 121 consisting of vanadium (V), about 1.5 µm in thickness of second layer 122 consisting of gold (Au), and about 10 nm in thickness of third layer 123 consisting of aluminum (Al) on the light-transparency electrode 110 in sequence.

The n-electrode 140 having multiple-layer structure is formed by depositing about 18 nm in thickness of first layer 141 consisting of vanadium (V) and about 100 nm in thickness of second layer 142 consisting of aluminum (Al) on the exposed portion of the n-type contact layer 140. When the Group III nitride compound semiconductor projection part 150 is formed at the portion where the n-type contact layer 104 is exposed, ruggedness is also left at the surface of the exposed portion of the n-type contact layer 104, which enables to have excellent ohmic contact to the n-electrode 140.

And a SiO$_2$ protection film 130 is formed at the uppermost layer of the device 100. At the external lowermost part, or the back surface of the sapphire substrate 101, a reflection metal layer 170 which consists of aluminum (Al) and has thickness of about 500 nm is formed through metal deposition treatment. The reflection metal layer 170 may comprise, for example, a metal such as Rh, Ti and W and a nitride composition such as TiN and HfN.

A method for manufacturing the Group III nitride compound semiconductor device 100 as described above includes the following steps. The Group III nitride compound semiconductor device 100 is formed by gaseous phase epitaxial growth, called metal organic vapor phase deposition (hereinafter MOVPE). The gases employed in this process were ammonia (NH$_3$), a carrier gas (H$_2$ or N$_2$), trimethyl gallium (Ga(CH$_3$)$_3$) (hereinafter TMG), trimethyl aluminum (Al(CH$_3$)$_3$) (hereinafter TMA), trimethyl indium (In(CH$_3$)$_3$) (hereinafter TMI), silane (SiH$_4$), and biscyclopentadienyl magnesium (MgC$_5$H$_5$)$_2$) (hereinafter CP$_2$Mg).

The single crystal sapphire substrate 101 was placed on a susceptor in a reaction chamber for the MOVPE treatment after its main surface 'A' has been cleaned by an organic washing solvent and heat treatment. Then the sapphire substrate 101 was baked at 1100° C. in H$_2$ vapor fed into the chamber under normal pressure.

About 15 nm in thickness of AlN buffer layer 102 was then formed on the surface of the baked sapphire substrate 101 under conditions controlled by lowering the temperature in the chamber to 400° C., keeping the temperature constant, and concurrently supplying H$_2$, NH$_3$, and TMA.

The undoped GaN layer 103 was then formed on the buffer layer 102 under conditions controlled by keeping the temperature of the sapphire substrate 101 at 1150° C. and concurrently supplying H$_2$, NH$_3$, and TMG. About 5 µm in thickness of Silicon (Si) doped GaN was formed on the udoped GaN layer 103, as an n-type contact layer (high carrier concentration n$^+$-layer) 104 having Si concentration of 1×10$^{18}$/cm$^3$, under conditions controlled by concurrently supplying H$_2$, NH$_3$, TMG, and silane.

Then, by controlling supply amount of H$_2$, NH$_3$, TMG, TMA, and silane, about 25 nm in thickness of silicon (Si) doped Al$_{0.15}$Ga$_{0.85}$N is formed as an n-type clad layer 105 having Si concentration of 1×10$^{18}$/cm$^3$.

Then about 3 nm in thickness of undoped In$_{0.2}$Ga$_{0.8}$N and about 20 nm in thickness of undoped GaN were formed as a well layer 1061 and a barrier layer 1062, respectively, under conditions controlled by lowering the temperature of the sapphire substrate 101 to 825° C. and controlling supply amount of N$_2$ or H$_2$, NH$_3$, TMG and TMI. Similarly, two additional pairs comprising a well layer 1061 and a barrier layer 1062 were formed in sequence under the same conditions. Accordingly, an emission layer 106 having a multiple quantum well (MQW) structure with three pairs was formed.

About 25 nm in thickness of Mg-doped p-type Al$_{0.5}$Ga$_{0.85}$N, which is doped with Mg at doping concentration of 2×10$^{19}$/cm$^3$, was formed as a p-type clad layer (first p-layer) 107 under conditions controlled by keeping the temperature of the substrate 101 at 1050° C. and concurrently supplying $N_2$ or $H_2$, $NH_3$, TMG, TMA, and $CP_2Mg$ with controlling their supply amount. About 100 nm of p-type GaN, which is doped with Mg at doping concentration of $8 \times 10^{19}/cm^3$, was formed as a p-type contact layer (second p-layer) 108 under conditions controlled by concurrently supplying $N_2$ or $H_2$, $NH_3$, TMG, and $CP_2Mg$ with controlling their supply amount.

Then a Group III nitride compound semiconductor projection part 150 was formed as follows. After forming the above-described layers to the p-type contact layer (second p-layer) 108, an $SiO_2$ mask, which is abbreviated in figures, is uniformly formed on the growth plane through plasma-CVD. The Group III nitride compound semiconductor does not grow on the $SiO_2$ mask. Portions of the $SiO_2$ mask, corresponding to the portions at which the Group III nitride compound semiconductor projection part 150 is formed, was removed each in a circular shape 2 µm in diameter at an interval of 1 µm through photolithography and etched to expose the surface of the p-type contact layer (second p-layer) 108. The shape, size, arrangement and interval of the portion exposing the p-type contact layer (second p-layer) 108 can be arbitrarily designed according to the size of the plane for outputting lights and so forth.

The shape of the portion exposing the p-type contact layer (second p-layer) 108 may be a circle, a polygon, a stripe pattern, and an arbitrary texture. An interval between each exposed portion may be designed according to the size of the exposed portion.

About 1.5 µm in thickness of p-type GaN, which is doped with $8 \times 10^{19}/cm^3$ of Mg through selective growth, is formed as the Group III nitride compound semiconductor projection part 150 under conditions controlled by keeping the temperature of the substrate 101 at 1000° C. and concurrently supplying $N_2$ or $H_2$, $NH_3$, TMG, and $CP_2Mg$ with controlling supply amount. The Group III nitride compound semiconductor projection part 150 formed through selective growth is formed in a six-sided pyramid. Then the $SiO_2$ mask is removed through etching by using hydrofluoric acid based etching solution.

After carrying out the crystal growth process, an etching mask was formed on the p-type contact layer (second p-layer) 108 and the Group III nitride compound semiconductor projection part 150, a predetermined region of the etching mask was removed through photolithography and etching, and a portion of the Group III nitride compound semiconductor projection part 150, the p-type contact layer (second p-layer) 108, the p-type clad layer 107, the active layer 106, the n-type clad layer 105, and a portion of the n-type contact layer 104, each of which is not covered by the etching mask, are etched by reactive ion etching employing a gas which comprises chlorine (Cl). As a result, a part of the surface of the n-type contact layer 104 was exposed.

With leaving the etching mask used for exposing the n-type contact layer 104, a photoresist layer was laminated on the entire surface of the wafer, a window was formed at a predetermined portion of the exposed region of the n-type contact layer 105 through photolithography, a chamber was exhausted to create a high vacuum as $10^{-4}$ Pa or less, and vanadium (V) and aluminum (Al) having thickness of about 20 nm and 100 nm, respectively, were deposited thereon. After that, the photoresist layer and the etching mask were removed. Next, a photoresist layer was laminated on the surface of the wafer, an electrode forming portion of the photoresist layer which was formed on the p-type contact layer (second p-layer) 108 and the Group III nitride compound semiconductor projection part 150 was removed through photolithography, and a window was obtained.

Accordingly, the p-type contact layer (second p-layer) 108 and the Group III nitride compound semiconductor projection part 150 were exposed. After exhausting in high vacuum $10^{-4}$ Pa vacuum order or lower, about 4 nm in thickness of Co and about 10 nm in thickness of Au were deposited in sequence on the exposed surface of the p-type contact layer (second p-layer) 108 and the Group III nitride compound semiconductor projection part 150. Then the sample was took out from the reaction chamber and cobalt (Co) and gold (Au) laminated on the photoresist layer were removed by a lift-off. Accordingly, an light-transparency electrode for the p-type contact layer (second p-layer) 108 and the Group III nitride compound semiconductor projection part 150 was formed. Thereafter, the chamber in which the resultant sample was placed was evacuated by use of a vacuum pump, and subsequently $O_2$ gas was fed to the chamber, to thereby regulate the pressure of the chamber to 3 Pa. Thereafter, the temperature of the atmosphere of the chamber was maintained at about 550° C., and the sample was heated for about four minutes, to thereby reduce the resistances of the p-type contact layer (second p-layer) 108, the Group III nitride compound semiconductor projection part 150 and the p-type clad layer 107, as well as to alloy the light-transparency electrode 110 with the p-type contact layer (second p-layer) 108 and the Group III nitride compound semiconductor projection part 150 and in the same time to alloy the electrode 140 with the n-type contact layer 104. Thus, the electrode 140 toward the n-type contact layer 104 and the light-transparency electrode 110 toward the p-type contact layer (second p-layer) 108 and the Group III nitride compound semiconductor projection part 150 were obtained.

Subsequently, in order to form a p-electrode 120, a photoresist was uniformly applied onto the light-transparent electrode 110, and a window was formed at a region of the photoresist on which the thick-film positive electrode 120 was to be formed. Subsequently, about 18 nm in thickness of vanadium (V) layer 121, about 1.5 µm in thickness of gold (Au) layer 122, and about 10 nm in thickness of aluminum (Al) layer 123 were deposited onto the light-transparency electrode 110 in sequence. Thereafter, the p-electrode 120 was formed through a lift-off method. Then a protection film 130 consisting of $SiO_2$ was formed uniformly on the uppermost layer of the exposed surface through electron beam deposition, a photoresist was applied thereon, and photolithography was carried out, to thereby form windows at the p-electrode 120 and the n-electrode 140. Each of the window having equivalent area with each other was formed through wet etching in order to form a portion which exposes the p-electrode 120 and the n-electrode 140.

Thus, the face-up-type Group III nitride compound semiconductor device 100 which emits lights from the semiconductor layer side was produced.

SECOND EMBODIMENT

Figure 2:
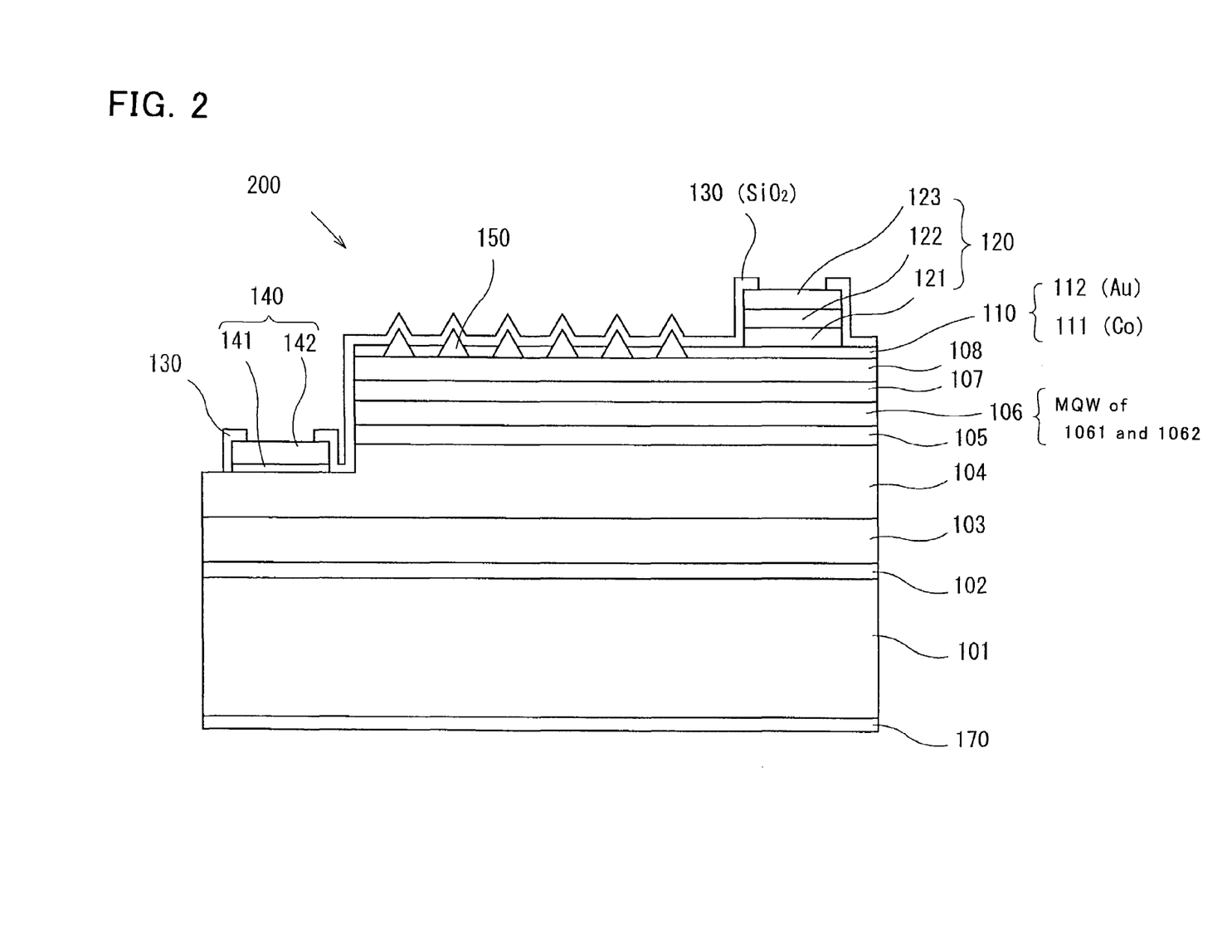
FIG. 2 is a cross-sectional view of a semiconductor light-emitting device 200 according to a second embodiment of the present invention.

FIG. 2 illustrates a sectional view of a Group III nitride compound semiconductor device 200 of a second embodiment.

The Group III nitride compound semiconductor device 200 was fabricated by the same method as that of the Group III nitride compound semiconductor device 100 of the first embodiment except that the Group III nitride compound semiconductor projection part 150 was formed through selective growth treatment without doping Mg and that the light-transparency electrode 110 was not formed on the Group III nitride compound semiconductor projection part 150.

COMPARATIVE EXAMPLE

Figure 3:
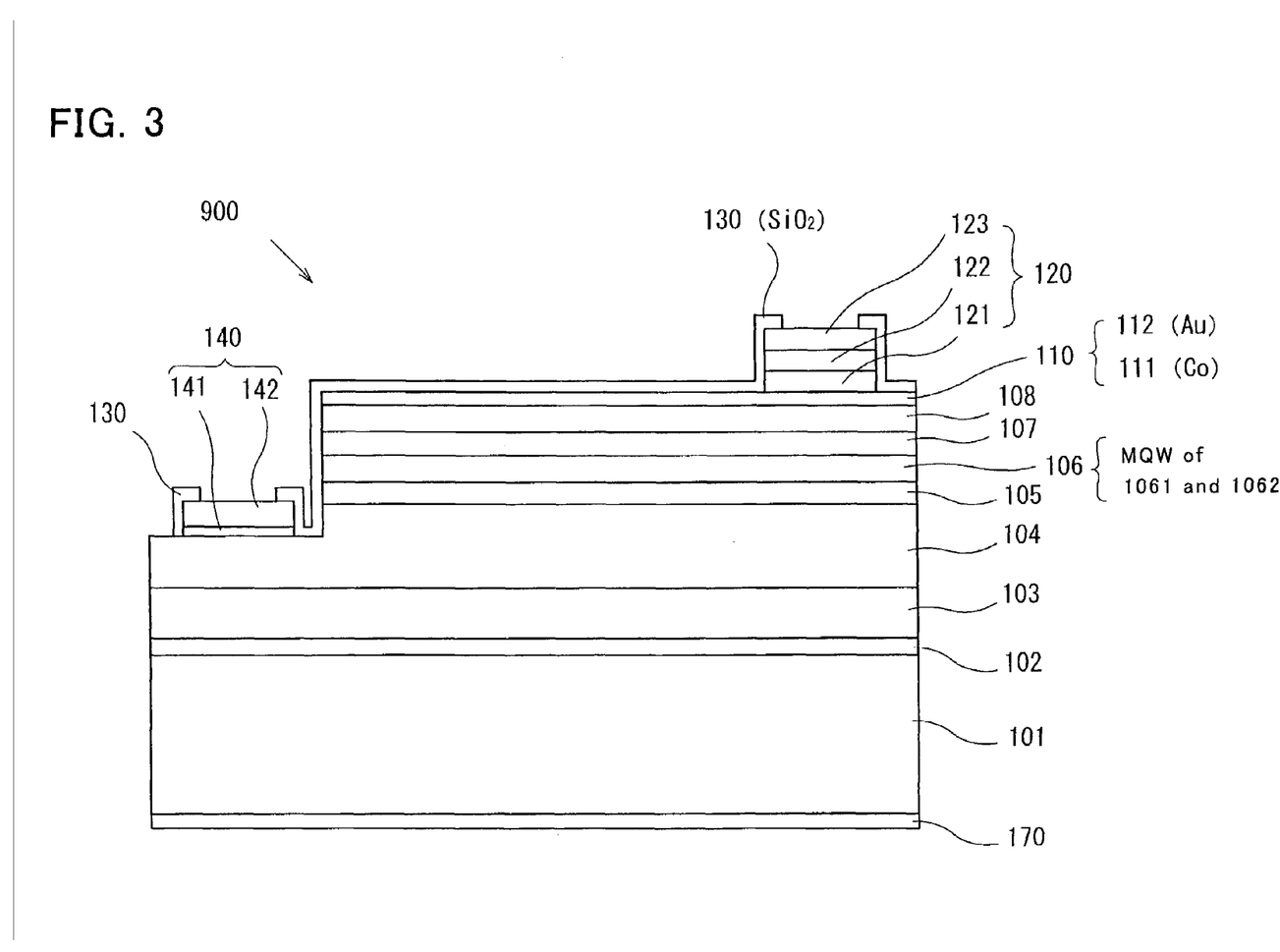
FIG. 3 is a cross-sectional view of a semiconductor light-emitting device 900 according to a comparative embodiment.

A light-emitting semiconductor device 900 of a comparative example as shown in FIG. 3 was fabricated by the same method as that of the Group III nitride compound semiconductor 100 except that the Group III nitride compound semiconductor projection part 150 was not formed.

Driving voltage and efficiency of outputting lights of each nitride compound semiconductor device in the first, second and comparative examples were measured. Compared with the comparative example, or a prior art, luminous intensity of each device of the first and the second embodiments was improved by 1.2 times, while driving voltage did not increase.

MODIFIED EXAMPLE

A light-emitting semiconductor device comprising a 300 nm in thickness of electrode was produced, which consists of indium tin oxide (ITO) in place of the light-transparency electrode 110 consisting of gold (Au) and cobalt (Co) comprised in each of the light-emitting semiconductor device 100 and the light-emitting device 200 shown in the first and the second embodiment. Luminous intensity of the light-emitting semiconductor device comprising indium tin oxide (ITO) light-transparency electrode was larger than that of the light-emitting semiconductor devices 100 and 200 of the first and the second embodiments, respectively, by 1.3 times, while driving voltage did not increase.

THIRD EMBODIMENT

Figure 4:
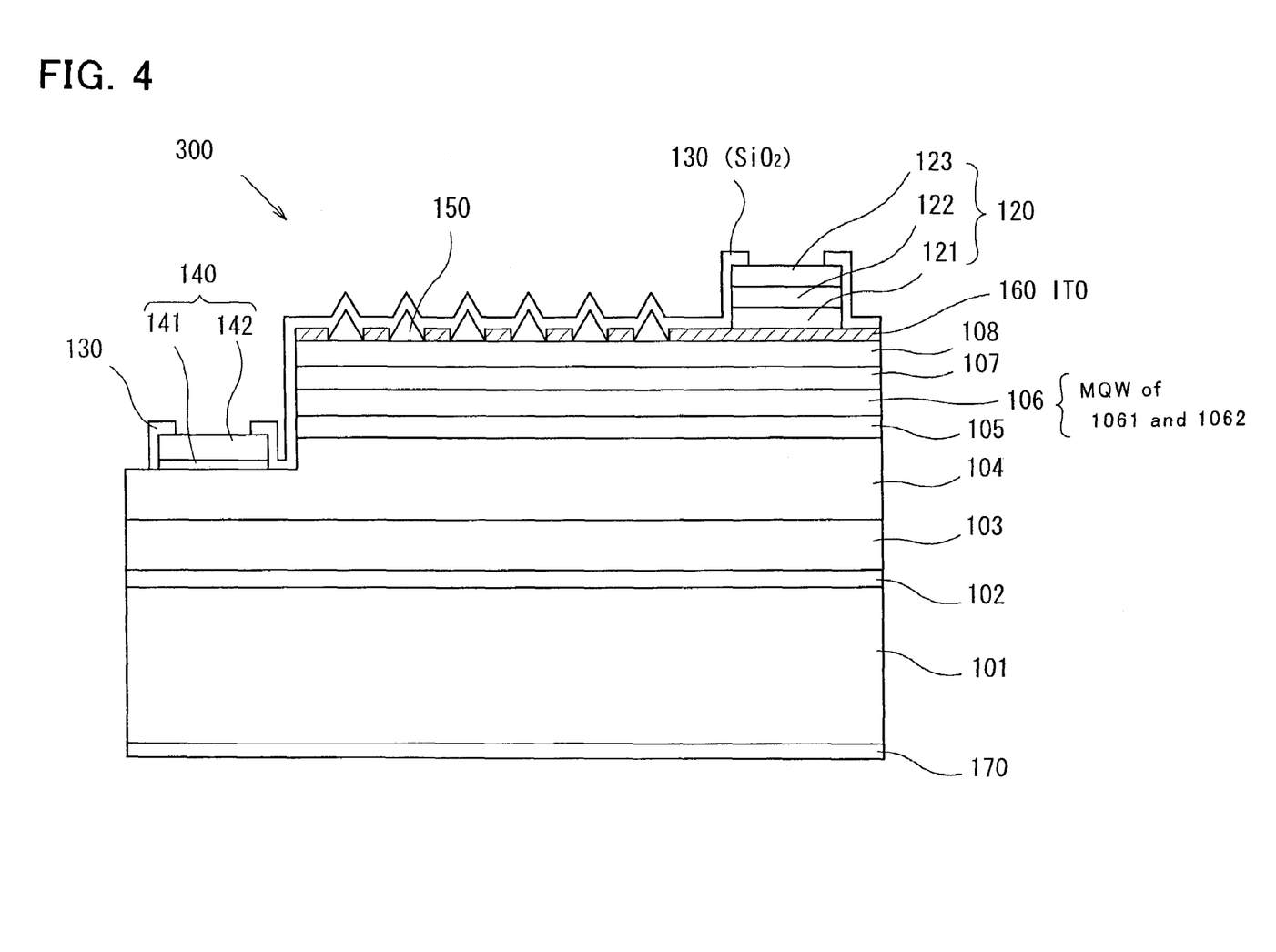
FIG. 4 is a cross-sectional view of a semiconductor light-emitting device 300 according to a third embodiment of the present invention.

In a third embodiment, a light-emitting semiconductor device 300 shown in FIG. 4 was produced. Similar to the first embodiment, an aluminum nitride (AlN) buffer layer 102 having a thickness of about 15 nm was formed on a sapphire substrate 101 having a thickness of about 100 μm. On the buffer layer 102, about 500 nm in thickness of an undoped GaN layer 103, about 5 μm in thickness of an n-type contact layer ($n^+$-layer having a high carrier concentration) 104 consisting of silicon (Si) doped GaN, which has doping concentration of $1\times10^{18}/cm^3$, about 25 nm in thickness of an n-type clad layer 105 consisting of silicon (Si) doped $Al_{0.15}Ga_{0.85}N$ whose doping concentration is $1\times10^{18}/cm^3$, an emission layer 106 having a multiple quantum well (MQW) structure, which comprises 3 pairs of about 3 nm in thickness of a well layer 1061 consisting of undoped $In_{0.2}Ga_{0.8}N$ and about 20 nm in thickness of a barrier layer 1062 consisting of undoped GaN, about 25 nm in thickness of p-type clad layer 107 consisting of Mg doped p-type $Al_{0.15}Ga_{0.85}N$, which has a doping concentration of $2\times10^{19}/cm^3$, and about 100 nm in thickness of p-type contact layer 108 consisting of Mg doped p-type GaN, which has a doping concentration of $8\times10^{19}/cm^3$, were formed in sequence.

Then an ITO layer having a thickness of 300 nm is formed thereon through sputtering and the ITO layer is partially etched by using the photoresist mask, to thereby form a window exposing the p-type contact layer 108 on which the Group III nitride compound semiconductor projection part 150 is to be formed. Each portion exposing the p-type contact layer 108 is formed in a circular shape 2 μm in diameter at an interval of 1 μm, which are same as those in the first embodiment. The ITO layer 160 obtained through the processes explained above is employed as a mask for selective growth for forming the Group III nitride compound semiconductor projection part 150. The ITO layer 160 may also function as a light-transparency electrode comprised in the light-emitting device 300.

Next, similar to the second embodiment, the Group III nitride compound semiconductor projection part 150 was formed through selective growth without doping Mg. Because the ITO layer 160 which is used as a mask for selective growth functions as a light-transparency electrode, it is not removed after selective growth.

Then, by employing reactive ion etching using the photoresist mask, the surface of the n-type contact layer 104 on which the n-electrode is to be formed is exposed. Then, as same as in the first embodiment, the p-electrode 120, the n-electrode 140, the protection film 130, and the reflective metal layer 170 on the back surface are formed in sequence.

The thus-obtained light-emitting semiconductor device 300 has luminous intensity approximately equivalent to that of the light-emitting semiconductor device according to the modified example comprising indium tin oxide (ITO) light-transparency electrode. And driving voltage of the light-emitting semiconductor device 300 is also equivalent to that of the light-emitting semiconductor device of the modified example comprising the ITO light-transparency electrode. In short, although the ITO layer 160 is used as a mask for the selective growth for forming the Group III nitride compound semiconductor projection part 150, no deterioration can be found in the ITO layer 160 functioning as a light-transparency electrode.

Figure 5A:
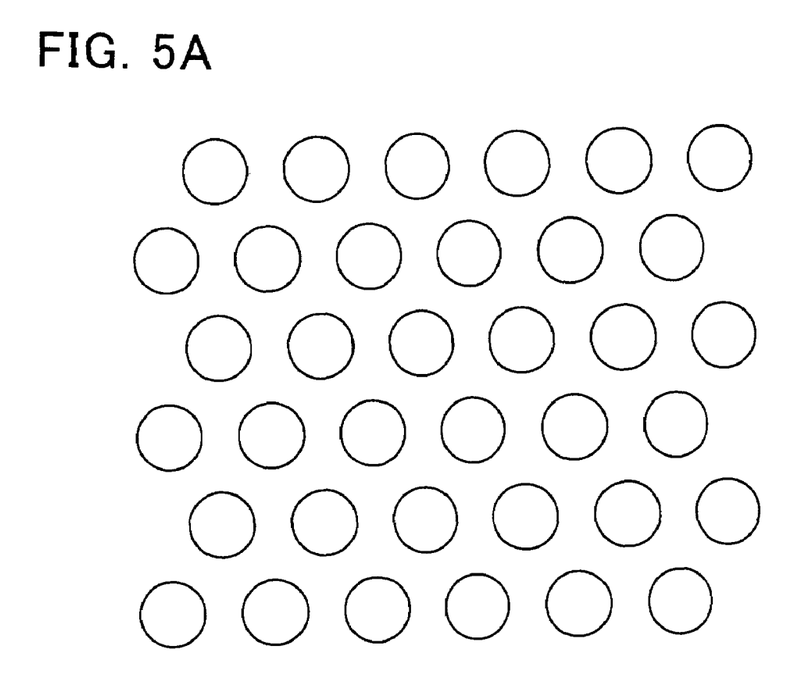
FIGS. 5A and 5B are plane views of masks of the present invention.
Figure 5B:
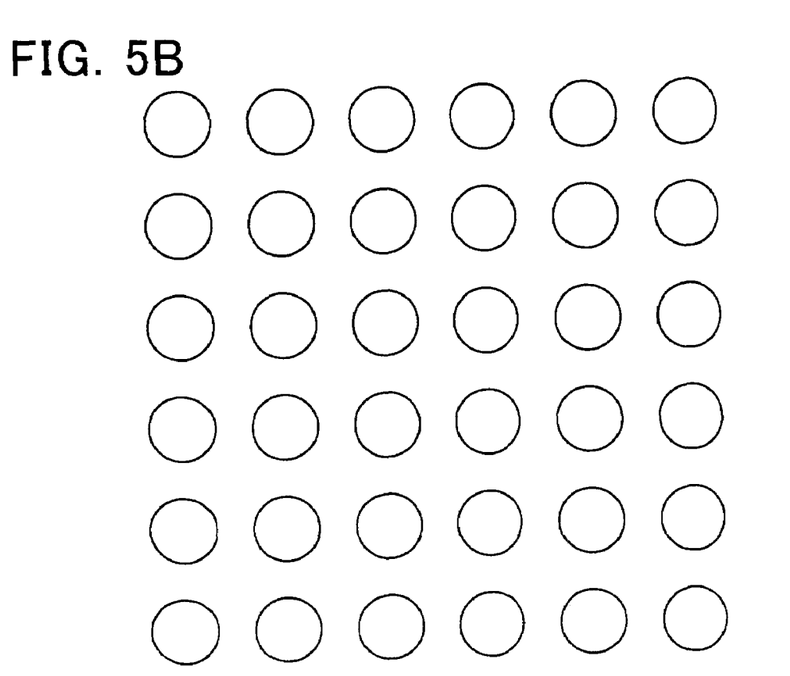

In the above embodiments, a window having a diameter of 2 μm is formed in a circular shape each at an interval of 1 μm in which the $SiO_2$ mask is removed in order to form a selective growth region. Such windows are formed as illustrated in FIGS. 5A and 5B. As explained above, the shape of a selective growth region is not limited to a circular shape. A mask may not be necessarily connected with each other, and alternatively all of each mask may be formed in an independent island pattern. When the layer which can be also used as a light-transparency electrode is applied to a mask for the selective growth, the light-transparency electrode is preferably formed in a pattern without any independent (isolated) part.

While the present invention has been described with reference to the above embodiments as the most practical and optimum ones, the present invention is not limited thereto, but may be modified as appropriate without departing from the spirit of the invention.

The invention claimed is:

1. A Group III nitride compound semiconductor light-emitting device comprising:
    a substrate;
    a plurality of Group III nitride compound semiconductor layers comprising a first layer as a top flat surface layer deposited on said substrate through epitaxial growth,
    a plurality of convex parts which are separated from each other and comprise Group III nitride compound semiconductor formed on said first layer through selective growth from said first layer; and
    a light-transparency electrode formed on an exposed portion of said first layer except for said plurality of convex parts.

2. A Group III nitride compound semiconductor light-emitting device according to claim 1, wherein said plurality of convex parts comprise undoped Group III nitride compound semiconductor and said first layer comprises Mg doped p-type Group III nitride compound semiconductor.

3. A Group III nitride compound semiconductor light-emitting device according to claim 1, wherein both said first layer and said plurality of convex parts comprise a p-type Group III nitride compound semiconductor.

4. A Group III nitride compound semiconductor light-emitting device according to claim 1, wherein said light-transparency electrode is further formed on the surface of said plurality of convex parts.

5. A Group III nitride compound semiconductor according to claim 1, wherein said light-transparency electrode comprises indium tin oxide (ITO).

6. A Group III nitride compound semiconductor light-emitting device according to claim 4, wherein said light-transparency electrode comprises indium tin oxide (ITO).

7. A Group III nitride compound semiconductor light-emitting device according to claim 3, wherein said light-transparency electrode is further formed on the surface of said plurality of convex parts.

8. A Group III nitride compound semiconductor light-emitting device according to claim 1, further comprising:
  a protection film formed on an entire surface of said plurality of convex parts and said light-transparency electrode.

9. A Group III nitride compound semiconductor light-emitting device according to claim 3, further comprising:
  a protection film formed on an entire surface of said light-transparency electrode.

10. A method for producing a Group III nitride compound semiconductor light-omitting device, comprising:
  forming an n-type Group III nitride compound semiconductor layer, an emission layer, and a p-type Group III nitride compound layer on a substrate;
  forming a mask on an uppermost layer of said Group III nitride compound semiconductor layer on which a Group III nitride compound semiconductor does not grow;
  removing a portion of the mask;
  selectively growing a Group III nitride compound semiconductor on the exposed portion of said uppermost layer where said mask is partially removed so as to form a plurality of convex parts for outputting lights on the surface of said uppermost layer;
  removing a remaining portion of said mask; and
  forming a light-transparency electrode on an exposed portion of said first layer except for said plurality of convex parts.

11. A method for producing a Group III nitride compound semiconductor light-emitting device according to claim 10, wherein a p-type impurity is doped in said selectively growing said Group III nitride compound semiconductor.

12. A method for producing a Group III nitride compound semiconductor light-emitting device according to claim 10, wherein growth temperature in said selectively growing is 1100° C. or less.

13. A method for producing a Group III nitride compound semiconductor light-emitting device according to claim 10, wherein said mask is fanned by using at least one of silicon oxide ($SiO_2$) and silicon nitride ($Si_3N_4$).

14. A method for producing a Group III nitride compound semiconductor light-emitting device according to claim 10, further comprising:
  forming said light-transparency electrode on said plurality of convex parts.

15. A method for producing a Group III nitride compound semiconductor light-emitting device according to claim 10, further comprising:
  forming a protection film on an entire surface of said plurality of convex parts and said light-transparency electrode.

16. A method for producing a Group III nitride compound semiconductor light-emitting device according to claim 14, further comprising:
  forming a protection film on an entire surface of said light-transparency electrode.

17. A method for producing a Group III nitride compound semiconductor light-emitting device according to claim 10, wherein said plurality of convex parts comprises undoped Group III nitride compound semiconductor and said uppermost layer comprises Mg doped p-type Group III nitride compound semiconductor.

18. A method for producing a Group III nitride compound semiconductor light-emitting device, comprising:
  forming an n-type Group III nitride compound semiconductor layer, an emission layer, and a p-type Group III nitride compound layer on a substrate;
  forming a light-transparency electrode comprising indium tin oxide (ITO) on an uppermost layer of said Group III nitride compound semiconductor layer on which a Group III nitride compound semiconductor does not grow;
  removing a portion of said light-transparency electrode; and
  selectively growing a Group III nitride compound semiconductor on the exposed portion of said uppermost layer where said light-transparency electrode is partially removed so as to form a plurality of convex parts for outputting lights on the surface of said uppermost layer.

19. A method for producing a Group III nitride compound semiconductor light-emitting device according to claim 18, further comprising:
  forming a protection film on an entire surface of said plurality of convex parts and said light-transparency electrode.

20. A method for producing a Group III nitride compound semiconductor light-emitting device according to claim 18, wherein said plurality of convex parts comprises undoped Group III nitride compound semiconductor and said uppermost layer comprises Mg doped p-type Group III nitride compound semiconductor.

* * * * *